United States Patent
Van Helleputte et al.

(10) Patent No.: US 9,294,048 B2
(45) Date of Patent: Mar. 22, 2016

(54) INSTRUMENTATION AMPLIFIER AND SIGNAL AMPLIFICATION METHOD

(71) Applicant: IMEC VZW, Leuven (BE)

(72) Inventors: Nick Van Helleputte, Korbeek Dijle (BE); Refet Firat Yazicioglu, Leuven (BE)

(73) Assignee: IMEC VZW, Leuven (BE)

( * ) Notice: Subject to any disclaimer, the term of this patent is extended or adjusted under 35 U.S.C. 154(b) by 85 days.

(21) Appl. No.: 14/315,478

(22) Filed: Jun. 26, 2014

(65) Prior Publication Data

US 2015/0002221 A1    Jan. 1, 2015

(30) Foreign Application Priority Data

Jun. 27, 2013   (EP) .................................. 13173913

(51) Int. Cl.
```
H03F 3/45      (2006.01)
H03F 1/34      (2006.01)
H03F 3/68      (2006.01)
```
(52) U.S. Cl.
CPC .. *H03F 1/34* (2013.01); *H03F 3/45* (2013.01); *H03F 3/45932* (2013.01); *H03F 3/68* (2013.01); *H03F 2003/4504* (2013.01); *H03F 2200/261* (2013.01); *H03F 2203/45084* (2013.01); *H03F 2203/45114* (2013.01); *H03F 2203/45116* (2013.01)

(58) Field of Classification Search
CPC ....................................................... H03F 3/45
USPC ............................................ 330/69, 260, 252
See application file for complete search history.

(56) References Cited

U.S. PATENT DOCUMENTS

| | | | |
|---|---|---|---|
| 7,126,423 B1 | 10/2006 | Kruiskamp | |
| 8,400,214 B2 * | 3/2013 | Draxelmayr | H03F 3/3022 330/259 |
| 8,829,991 B2 * | 9/2014 | Jordan | H03F 3/45959 330/252 |
| 2004/0077961 A1 | 4/2004 | Yonce | |
| 2005/0116773 A1 * | 6/2005 | Laletin | G01R 31/3004 330/69 |
| 2012/0188009 A1 | 7/2012 | Alexander et al. | |

FOREIGN PATENT DOCUMENTS

WO       2013/008925 A1    1/2013

OTHER PUBLICATIONS

European Search Report, European Patent Application No. 13173913.8, dated Sep. 27, 2013.
(Continued)

*Primary Examiner* — Henry Choe
(74) *Attorney, Agent, or Firm* — McDonnell Boehnen Hulbert & Berghoff LLP (57) ABSTRACT

An instrumentation amplifier includes a first amplifier having one input connected to a first input of the instrumentation amplifier, a second amplifier having one input connected to a second input of the instrumentation amplifier, and a feedback network. The feedback network including an active filter having a first low pass filter characteristic with a first cut-off frequency in respect of differential mode signals at the first and second inputs of the instrumentation amplifier, and a second low pass filter characteristic with a second cut-off frequency in respect of common mode signals at the first and second inputs of the instrumentation amplifier. The disclosure also relates to a device for acquiring biopotential signals and a signal amplification method.

15 Claims, 7 Drawing Sheets

(56) References Cited

OTHER PUBLICATIONS

Denison, Timothy et al., "A 2.2μW 94nV/√Hz, Chopper-Stablized Instrumentation Amplifier for EEG Detection in Chronic Implants", 2007 IEEE International Solid-State Circuits Conference, ISSCC 2007 / Session 8 / Biomedical Devices / 8.6, Feb. 1, 2007, pp. 162-163 and 594.

Farshchi, Shahin et al., "Low-Noise Amplifier Circuit for Embedded Electrophysiological Recording with Adjustable Gain and High-Pass Filtering", 16th Biennial University/Government/Industry Microelectronics Symposium, Jan. 1, 2006, pp. 105-108.

* cited by examiner

INSTRUMENTATION AMPLIFIER AND SIGNAL AMPLIFICATION METHOD

CROSS-REFERENCE TO RELATED APPLICATION

This application claims priority to European Patent Application No. 13173913.8 filed on Jun. 27, 2013, the contents of which are hereby incorporated by reference.

TECHNICAL FIELD

The disclosure relates to instrumentation amplifiers and amplification methods, such as for use in amplifying biopotential signals in biomedical applications, for example, ECG (electrocardiography), EEG (electroencephalography) or EMG (electromyography).

BACKGROUND

Biopotentials are usually recorded using electrodes attached to the body, such as wet (gel) electrodes, or dry electrodes. The electrodes are used to measure biopotentials, which typically have a magnitude in the range of about 50 uV to 10 mV.

The electrodes can have different polarization voltages, resulting in a large DC or very slowly varying signal (time constant well below 1 s) present between the electrodes, for example, on the order of 300 mV. Furthermore, the biopotential signals can be affected by interference currents derived from mains power supply lines, known as "common mode aggressors." The mains frequency generally falls within the frequency range of interest of biomedical signals. For example, an ECG signal has its main frequency components in a range between about 0.5 Hz to 40 Hz, but signal information up to around 200 Hz may be desired.

Instrumentation amplifiers ("IAs") are generally used for biomedical signals, as result of their high common mode rejection ratio, enabling small differential signals to be amplified with a large gain. However, a large DC offset can saturate the IA.

To address this potential problem, the IA is for example preceded by a high-pass filter. This filter may use at least two large external capacitors to implement sufficiently low cut-off frequency without impacting important performance metrics.

Alternatively, a DC-coupled architecture is used. To avoid channel saturation in this case, the IA may not have too much gain, which means that the requirements in terms of noise and dynamic range for subsequent blocks (which can include programmable gain amplifiers, filters and analog-to-digital converters) become stricter.

A DC-coupled architecture typically uses a resistive feedback loop. A possible drawback of this approach is that only low gain factors can be used to avoid channel saturation. As a consequence, there may be strict requirements in terms of noise and dynamic range on the subsequent processing blocks.

One article that generally discloses the use of an analog feedback loop to provide DC-offset cancellation is: Denison T., Consoer K., Kelly A., Hachenburg A., Santa W., "A 2.2 µW 94 nV/√Hz, Chopper-Stabilized Instrumentation Amplifier for EEG Detection in Chronic Implants," IEEE International Solid-State Circuits Conference, pp. 162-594, 11-15 Feb. 2007.

SUMMARY

The present disclosure provides an improved instrumentation amplifier. According to one embodiment, there is provided an instrumentation amplifier that includes a first amplifier having one input connected to a first input of the instrumentation amplifier, a second amplifier having one input connected to a second input of the instrumentation amplifier, and a feedback network. The feedback network includes an active filter having a first low pass filter characteristic with a first cut-off frequency in respect of differential mode signals at the first and second inputs of the instrumentation amplifier, and a second low pass filter characteristic with a second cut-off frequency in respect of common mode signals at the first and second inputs of the instrumentation amplifier.

By providing a low pass filter function in a feedback loop, the amplifier may have a high pass filter function. The low pass filter function for differential mode signals is for passing essentially only the differential DC component, and thereby enables the DC offset between inputs to be cancelled. The low pass filter function for common mode signals is for passing common mode aggressors, such as at mains frequencies, and thereby enables the common mode aggressors to be suppressed without affecting the desired differential mode signals at the same frequency. Thus, the second cut-off frequency may be higher than the first cut-off frequency.

By providing an active filter, e.g., with gain, these common mode aggressors are actively filtered. The disclosure thus provides an amplifier with high common mode rejection, and also with rejection of differential DC signal components. It enables this to be achieved without impacting on input impedance, noise levels or power capability.

The filtering can be entirely in the analog domain avoiding the need for DACs and ADCs.

In one example, the feedback network has a gain of more than 1 for common mode signals at the first and second inputs of the instrumentation amplifier at 50 Hz and/or at 60 Hz.

The first and second amplifiers can be combined to form a dual difference amplifier, or they may be separate amplifiers.

The active filter can comprise two low pass gm-C filters for example based on a transconductance amplifier and a capacitor which can be a parasitic capacitor. The filter cut-off frequency can be as high as possible whilst maintaining stability. Thus, very small filter capacitances are required enabling the use of parasitic capacitors.

In one set of examples, the first and second amplifiers each have a non-inverting input and an inverting input, with the first and second inputs provided to the non-inverting inputs. The feedback network can then include a first low pass gm-C filter between the output or an intermediate node and the inverting input of the first amplifier, a second low pass gm-C filter between the output or an intermediate node and the inverting input of the second amplifier, and a capacitor between the inverting inputs of the first and second amplifiers.

The gm-C filters provide the active common mode filter characteristic. The further capacitor gives rise to the different filter responses for common mode and differential mode signals, in particular, because it plays no role in defining the frequency response for common mode signals.

The amplifier can further comprise a common mode feedback circuit, which includes a resistive divider between the outputs of the first and second amplifiers and a comparator for comparing the divider output with a reference voltage, wherein the comparison result is provided to the feedback network. This provides a gain loop only for common mode signals, which thereby further suppresses the common mode aggressors.

The first low pass filter characteristic can give rise to a high pass cut-off frequency for the overall instrumentation amplifier of 0.5 Hz or lower, so that it is aimed only at the DC signals, namely the electrode polarization voltages in the case of an ECG or EEG or EMG system. This first cut-off frequency is then less than the signal bandwidth of interest of the differential input signals.

The second low pass filter characteristic may give rise to a high pass cut-off frequency for the overall instrumentation amplifier of 200 Hz or higher so that the frequencies of interest (which include the mains aggressor frequencies at 50 or 60 Hz) are within the pass band. In this way, the feedback network may have a gain of more than 1 for common mode signals at the first and second inputs of the instrumentation amplifier at 50 Hz and/or at 60 Hz.

The instrumentation amplifier can be used as part of a device for acquiring biopotential signals, for example, an ECG, EEG or EMG amplifier.

The disclosure also provides a signal amplification method that includes amplifying a first input signal using a first amplifier, amplifying a second input signal using a second amplifier, and in a feedback network connected to the first and second amplifier outputs and inputs: applying a first low pass filter characteristic to differential mode signals between the first and second input signals thereby to pass differential DC signals and block differential mode signals at the frequencies of interest; and applying a second low pass filter characteristic to common mode signals between the first and second inputs signals thereby to pass and amplify common mode signals.

This method provides a feedback approach that enables the amplifier to suppress DC offsets as well as common mode aggressors.

BRIEF DESCRIPTION OF THE DRAWINGS

Examples of embodiments of disclosure will now be described in more detail, with reference to the accompanying drawings, in which.

BRIEF DESCRIPTION OF THE DRAWINGS

According to an embodiment of the disclosure, there is provided an instrumentation amplifier that has a feedback network between the outputs and inputs of two forward amplifiers. The feedback network implements an active filter having a first low pass filter characteristic for differential mode signals at the first and second inputs of the instrumentation amplifier and a second low pass filter characteristic for common mode signals at the first and second inputs of the instrumentation amplifier. This means the amplifier has a high pass filter forward response that helps to suppress common mode aggressors without adversely affecting differential signals at the same frequency, as well as suppressing DC offset voltages.

In this way, the DC-offset may be removed without compromising important performance metrics like noise and CMRR, and without relying on matched external passive components, while still allowing large front-end gain factors.

Figure 1:
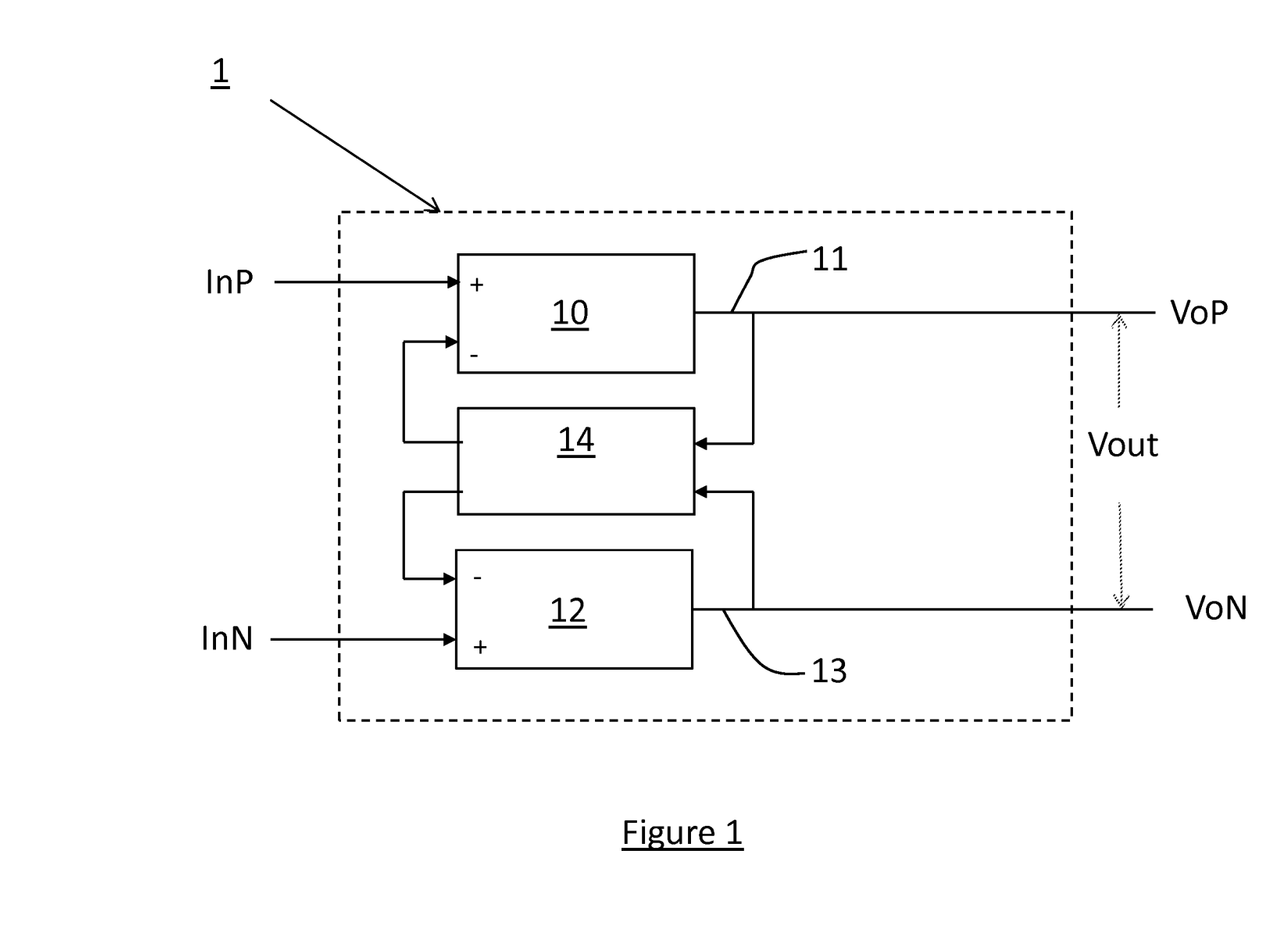
FIG. 1 shows schematically the general operation of an amplifier of the disclosure.

FIG. 1 shows the amplifier 1 of the disclosure in schematic form.

The amplifier is provided with two differential inputs InP and InN. The first input InP is provide to one of the differential inputs of a first amplifier 10 that generates an output 11. The second input InN is provided to one of the differential inputs of a second amplifier 12 that generates an output 13.

A feedback network 14 is provided between the outputs of the two amplifiers 10,12 and their inputs (although as will be explained below, the feedback network can connect to intermediate nodes within the amplifiers rather than the amplifier outputs). In the example shown, the inputs InN and InP are provided to non-inverting inputs of the amplifiers, and the feedback network 14 couples to the inverting inputs of the amplifiers. Thus, the feedback network implements negative feedback.

In one example, the feedback network comprises an active filter having a first low pass filter characteristic for differential mode signals at the first and second inputs InP, InN, and a second low pass filter characteristic with higher cut-off frequency for common mode signals at the first and second inputs of the instrumentation amplifier.

By implementing this low pass filter function in a negative feedback loop, the amplifier has a high pass filter characteristic.

The two forward path amplifiers 10,12 can be opamps, with closed loop gain control, or they may be instrumentation amplifiers. Typically, the forward gain of the amplifiers 10,12 is of the order of magnitude of tens or hundreds (volts per volt), for example, in the range of 10 to 1000, or 20 to 500.

The output of the amplifier 1 is shown as a differential pair of outputs VoP and VoN. A further amplifier can be provided for differential to single-ended conversion if required.

The overall amplifier design imposes less strict requirements on subsequent building blocks coupled to the amplifier. Contrary to normal high pass filters or DC servos, the filter of the feedback network attenuates only the differential signals but is transparent to (and therefore passes) the common mode signals within the frequency band of interest.

By passing the common mode signals in the low pass filter in the feedback loop, channel saturation may be avoided or reduced.

Figure 2:
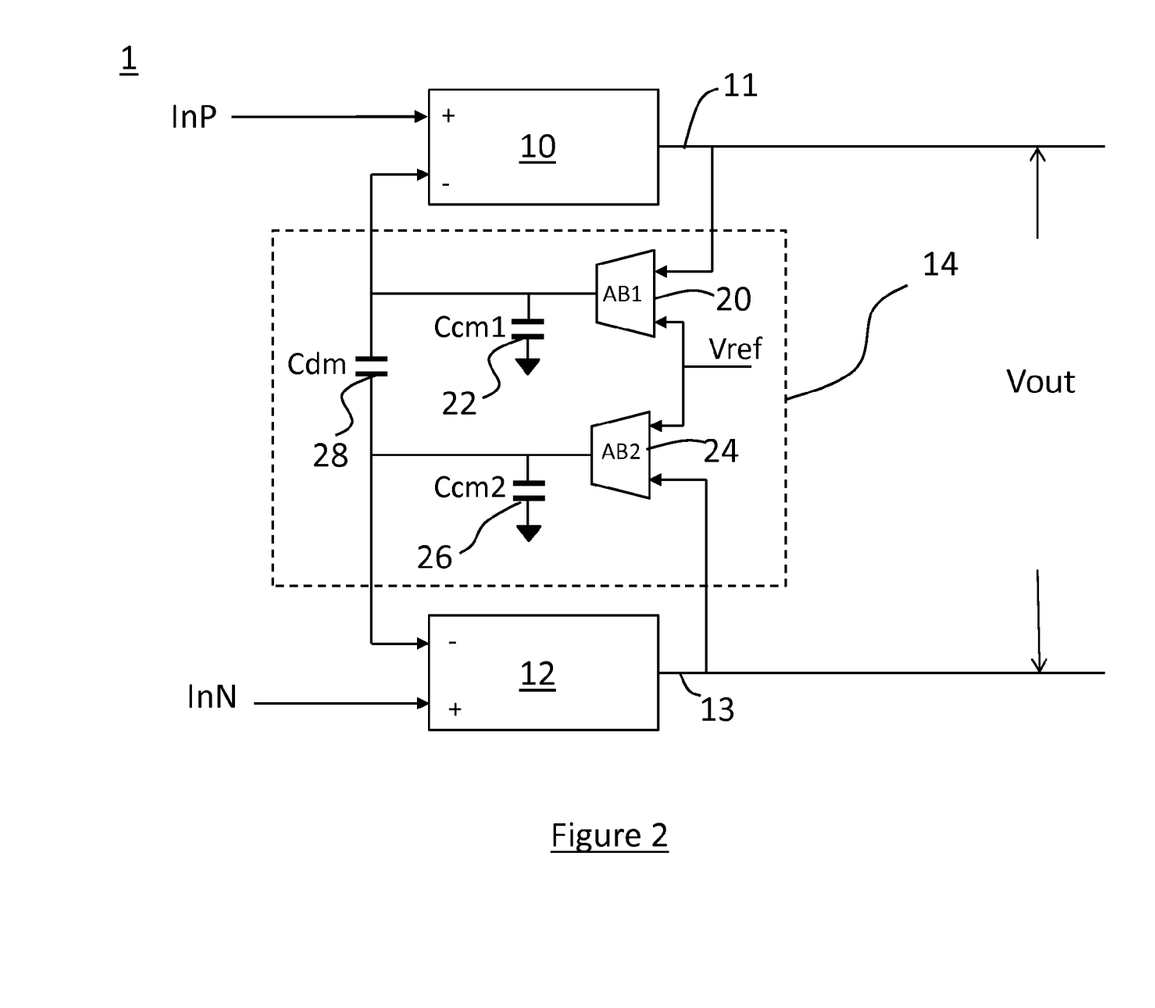
FIG. 2 shows a first example of an amplifier of the disclosure.

FIG. 2 shows a first implementation of the amplifier of the disclosure.

In this example, the feedback network 14 includes a low pass gm-C filter for each amplifier between the respective amplifier output 11, 13 and the inverting input. This comprises a transconductor or transconductance amplifier 20, 24 in the series path, and a shunt capacitor 22, 26 (shown as Ccm1 and Ccm2).

For common mode signals, the filter should pass the full frequency band of interest, thus including the mains aggressors. As a result, a high cut off frequency is possible, enabling the shunt capacitor to be extremely small, for example, formed by parasitic capacitances of the transconductance amplifier.

The outputs of the two filters connect to the inverting inputs of the amplifiers. Furthermore, a differential mode capacitor 28 (shown as Cdm) is coupled between these outputs, and therefore between the inverting inputs of the first and second amplifiers.

The transconductance amplifiers can have a transconductance of between about 10 to 1000 nS (nano Siemens) and the capacitors can have a capacitance of between about 10 to 1000 fF.

The differential mode capacitor 28 may be used to define the cut-off frequency for differential mode signals and can have a capacitance of between about 100 nF to 100 uF. In particular, the low pass filter cut-off frequency depends on both Cdm and Ccm for the differential signals.

However for the common mode signals, the capacitor Cdm may have no effect, because the same common mode signal will be present on both terminals. Thus, the filter in FIG. 2 allows implementation of very different cut-off frequencies for common mode signals and differential mode signals. It also enables the desired differential high-frequency signal to be separated from the unwanted differential low-frequency (and DC) signal.

Figure 3:
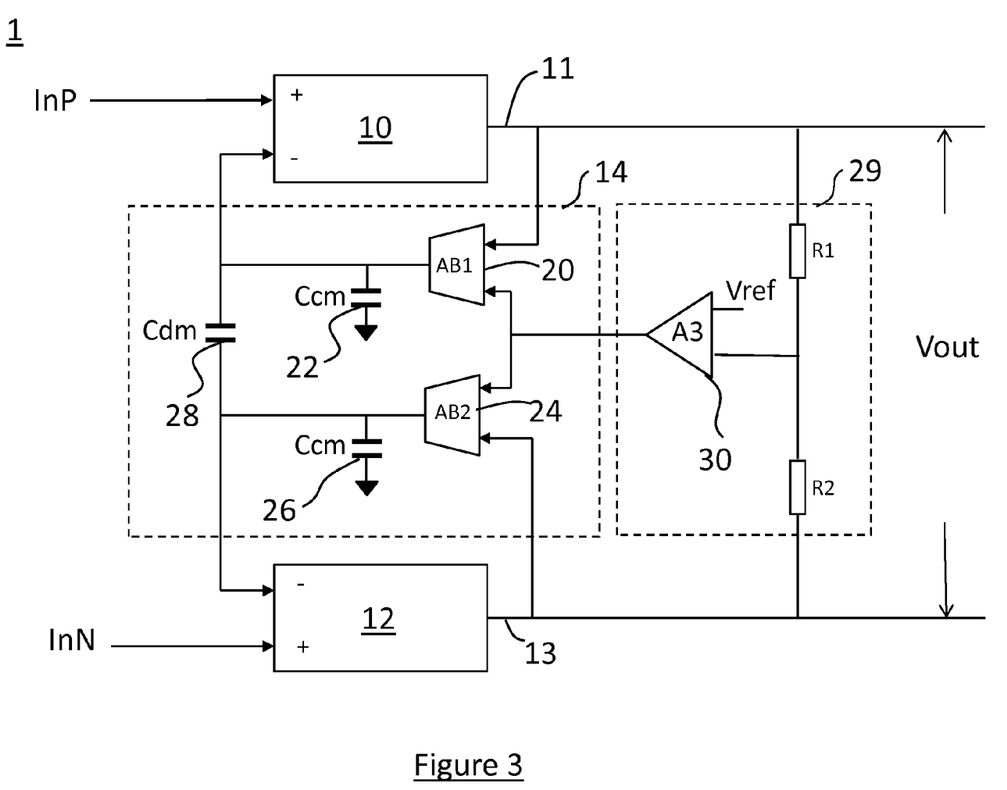
FIG. 3 shows a second example of an amplifier of the disclosure.

FIG. 3 shows a second example in which a common mode feedback circuit 29 is added. The feedback circuit 29 comprises a resistive divider R1, R2 between the outputs of the first and second amplifiers, and a comparator 30 for comparing the divider output with a reference voltage Vref. The comparison result is provided to the feedback network as the reference voltage for the transconductance amplifiers 20, 24.

This may help to provide increased gain in the feedback path of the common mode signals, and thereby increased rejection of the mains frequency aggressors.

Figure 4:
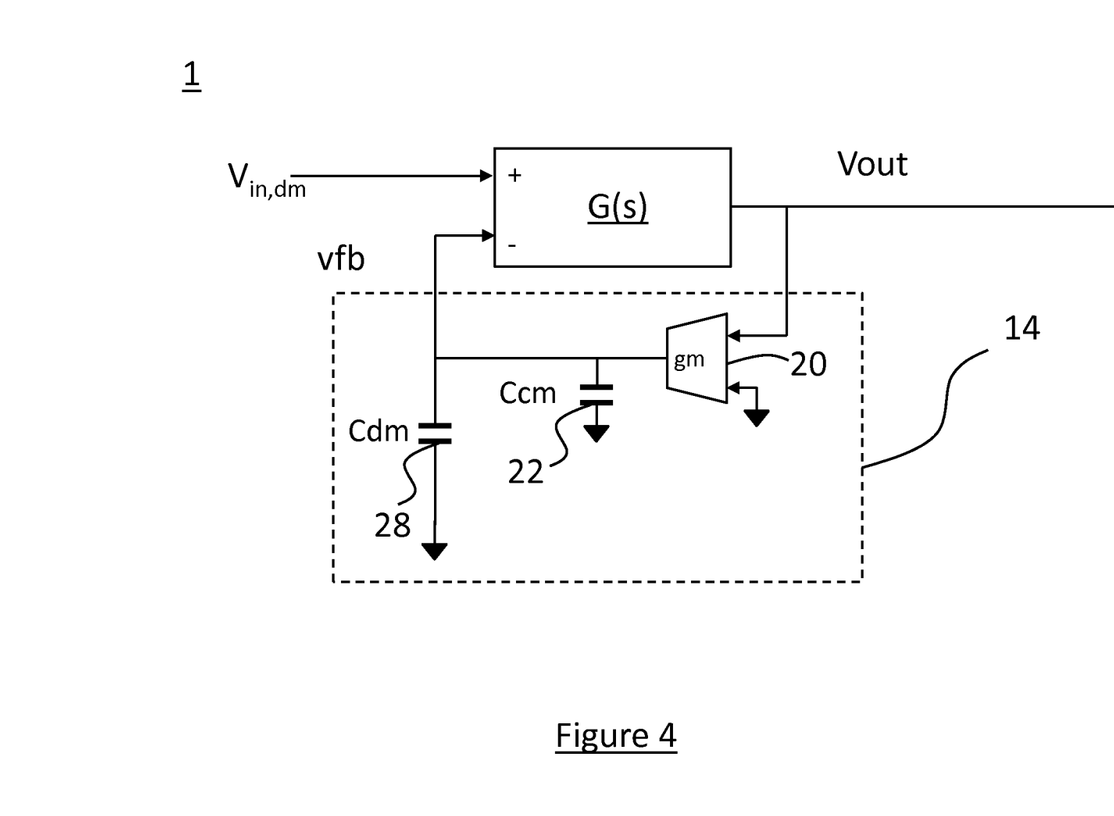
FIG. 4 shows the circuit configuration for differential mode signals and is used to explain the differential mode transfer function.

Referring back to the implementation of FIG. 2, the transfer function of the high-frequency differential output (Vout, HF) can be shown by conventional signal flow analysis:

FIG. 4 shows the equivalent single-ended signal flow diagram for differential inputs.

$$V_{out} = G(s)(V_{in,dm} - vfb)$$

$$vfb = V_{out} \cdot g_m \cdot sC$$

Solving both equations for vfb yields:

$$V_{out} = G(s)(V_{in,dm} - V_{out} \cdot g_m \cdot sC)$$

$$V_{out} + V_{out} \cdot g_m \cdot sC \cdot G(s) = G(s) \cdot V_{in,dm}$$

Rearranging gives the differential mode transfer function.

$$\frac{V_{out}}{V_{in,dm}} \approx \frac{G(s)}{1 + \frac{G(s)g_m}{sC}}$$

In this equation: G(s) is the frequency-dependent gain of the main amplifiers 10, 12; gm is the transconductance gain of the active block in the feedback network, this active block can be a gm-stage, an operational transconductance amplifier ("OTA") or an operational amplifier; and C is the parallel combination of Cdm and Ccm.

Figure 5:
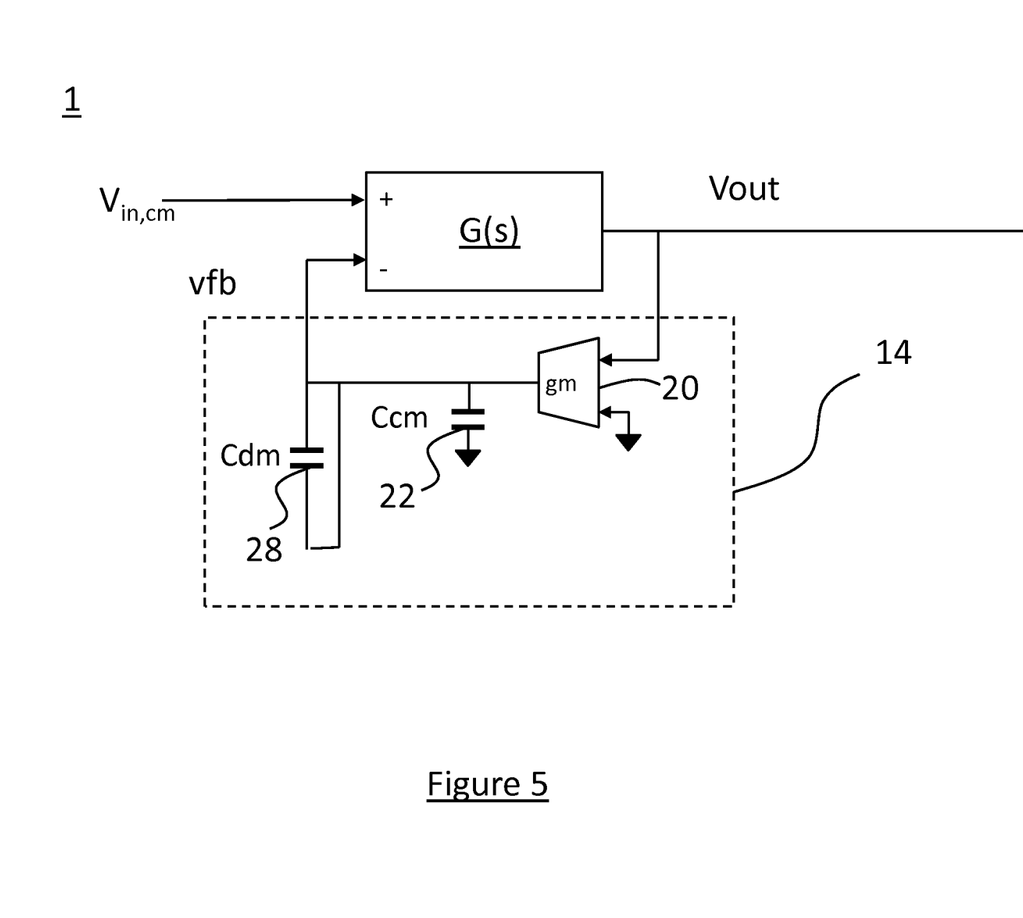
FIG. 5 shows the circuit configuration for common mode signals and is used to explain the common mode transfer function.

The transfer function for the common mode input signals can also be shown by conventional signal flow analysis. FIG. 5 shows the equivalent single-ended signal flow diagram for common-mode inputs. For common-mode inputs, the capacitor Cdm is shorted and hence does not appear in the transfer function:

$$V_{out} = G(s)(V_{in,cm} - vfb)$$

$$vfb = V_{out} \cdot g_m \cdot sC$$

Solving both equations for vfb yields:

$$V_{out} = G(s)(V_{in,cm} - V_{out} \cdot g_m \cdot sC)$$

$$V_{out} + V_{out} \cdot g_m \cdot sC \cdot G(s) = G(s) \cdot V_{in,cm}$$

Rearranging gives the differential mode transfer function.

$$\frac{V_{out}}{V_{in,dm}} \approx \frac{G(s)}{1 + \frac{G(s)g_m}{sC}}$$

In this equation, C represents only Ccm and G(s) is the frequency-dependent gain of the forward amplifiers.

The transfer function represents a high-pass filter with the cut-off frequency being equal to G(s)gm/C, and the value of C is different for common mode and for differential mode.

Hence, the cut-off frequencies for differential signals and for common mode signals can be designed independently of each other allowing the filter to pass all the common mode signals within the signal band of interest, but only to pass the unwanted low-frequency differential content.

The fully differential filter depends on only a single capacitor Cdm (assuming Cdm>>Ccm) for the differential mode high pass cut-off frequency (e.g., 0.5 Hz), meaning the filter can be implemented with only a single external component (capacitor 28).

Thus, by properly designing Cdm and Ccm, the feedback network filter output will include the differential low-frequency (and DC) signal and common mode aggressors within the frequency band of interest (typically at 50 Hz/60 Hz). By providing these signals in the feedback path, they are attenuated relative to the differential signal in the band of interest The circuit may provide significant suppression due to the inherent common-mode rejection of the forward amplifiers. This is a potential benefit compared to the standard 3-opamp instrumentation amplifier structure (which uses a passive feedback network) where the common-mode signals are not attenuated. Subsequent blocks thus still see a large common-mode variation. By attenuating the common-mode signals, subsequent blocks do not need to take account of common-mode signals anymore.

Each forward amplifier 10, 12 will see only half of the differential high-frequency input signal appearing across its input terminals. Hence, there is no risk of amplifier saturation and normal large amplification factors can be used.

Figure 6:
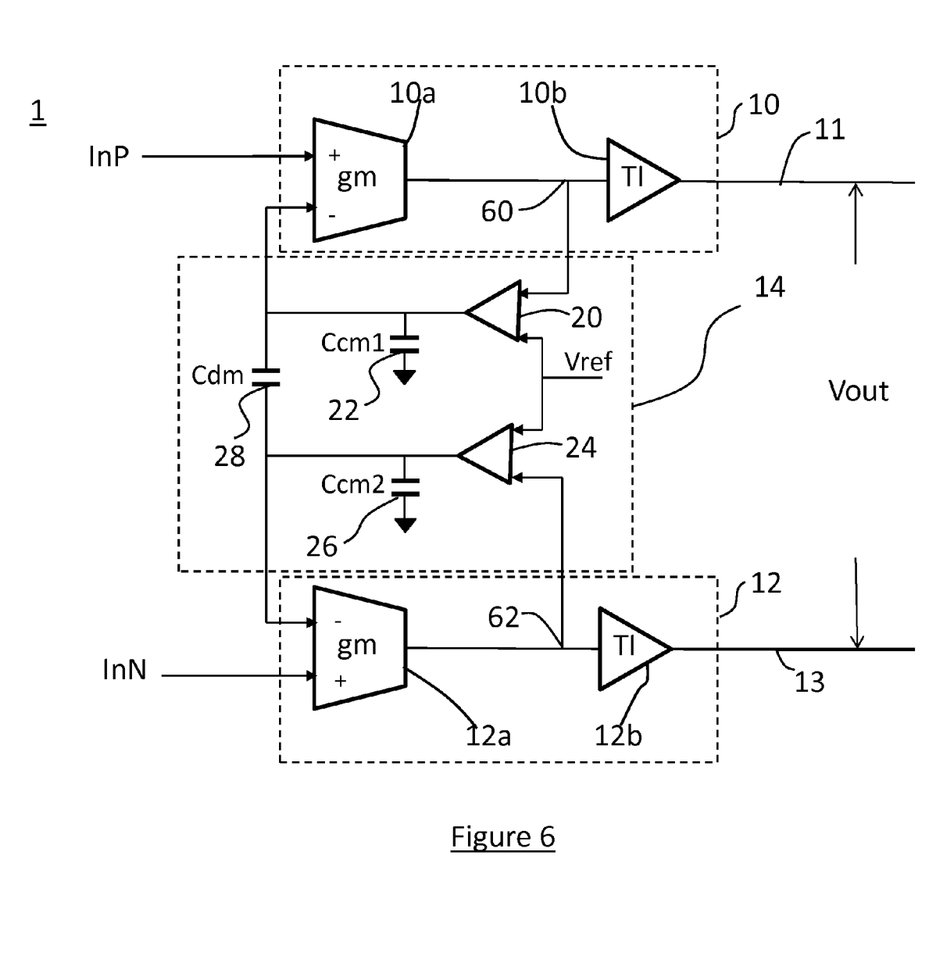
FIG. 6 shows a third example of an amplifier of the disclosure.

FIG. 6 shows a third example of an amplifier circuit of the disclosure, in which each forward amplifier 10, 12 is formed from a gm stage 10a, 12a followed by a transimpedance stage 10b, 12b, resulting in an overall voltage amplifier. The input from the feedback structure is taken from an internal node of the amplifier between the two stages, and an open loop amplifier 60 is used in the feedback path instead of a gm component. The internal node of the first amplifier 10 is shown as 60 and the internal node of the second amplifier 12 is shown as 62. Thus, it can be seen that the feedback filters can receive as their input a signal at the output 11; 13 of a respective amplifier or an intermediate node 60; 62 of a respective amplifier.

Figure 7:
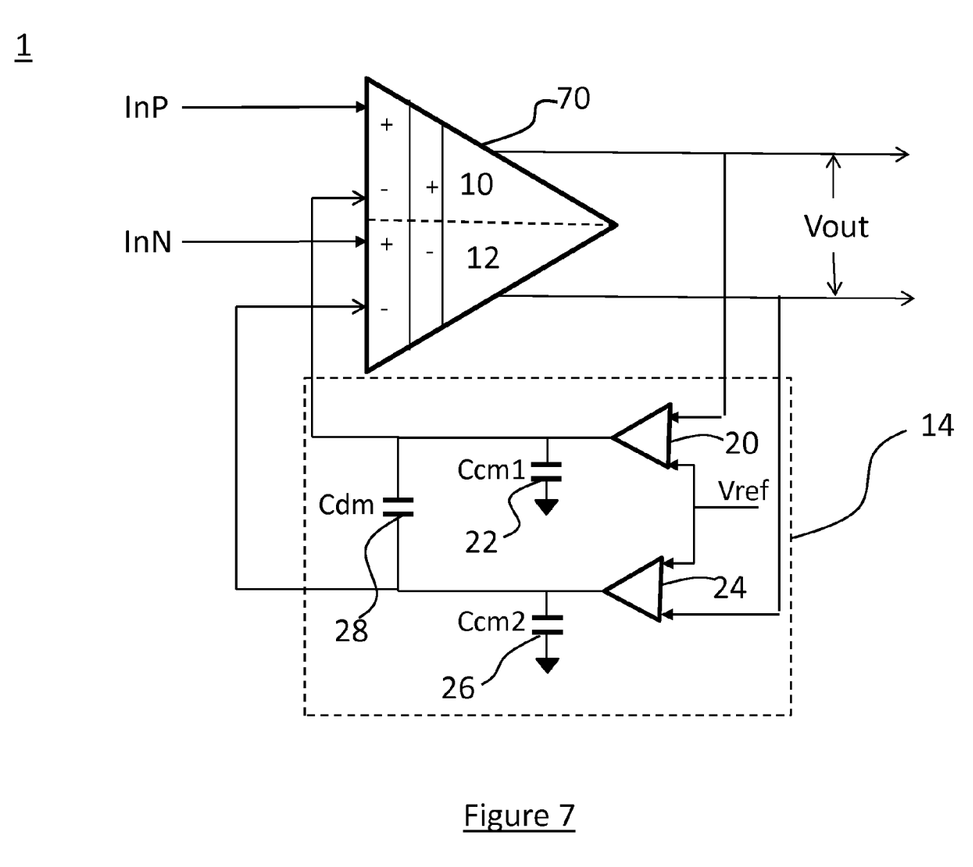
FIG. 7 shows a fourth example of an amplifier the disclosure.

FIG. 7 shows another alternative where a dual difference amplifier (DDA) 70 is used in the forward path. This combines the functions of the two amplifiers 10, 12 as shown. The amplifier receives both inputs as well as both feedback paths.

The disclosure does not require the use of power-hungry high resolution DACs and digital signal processing.

According to an embodiment, the disclosure is based on the concept of using a feedback signal to provide a DC error signal as well providing common mode suppression. The feedback acts as a DC-filter on differential signals only, but is transparent to common mode signals. Hence, an error signal can be fed all the way to the input. Since the common mode signal is replicated at the inputs, it can be rejected by the large common mode rejection ratio of the main amplifiers 10, 12, particularly if they are implemented as instrumentation amplifiers. The implementation amplifier can filter out large DC-offsets (e.g., greater than 1V) and is limited only by the output range of the amplifiers in the feedback network and common mode input range of the forward path amplifiers.

The components of the circuit may be selected using known techniques to find a suitable combination of loop stability and gain.

The disclosure may be of particular interest for biopotential signal amplification. However, it is equally applicable to other small signal amplification where DC levels may vary and a high common mode rejection ratio is needed.

Two examples of possible filter design have been given, but those skilled in the art will be able to derive other filter designs that achieve the same aim of providing a different low pass frequency response for common mode signals as for differential signals in the amplifier feedback loops.

By way of example, the first and second amplifiers can have a gain between about 10 to 1000, or between about 20 to 500. They can for example each themselves comprise an instrumentation amplifier.

Various other modifications will be apparent to those skilled in the art.

The invention claimed is:

1. An instrumentation amplifier comprising:
    a first amplifier having one input connected to a first input of the instrumentation amplifier;
    a second amplifier having one input connected to a second input of the instrumentation amplifier; and
    a feedback network comprising an active filter having a first low pass filter characteristic with a first cut-off frequency in respect of differential mode signals at the first and second inputs of the instrumentation amplifier, and a second low pass filter characteristic with a second cut-off frequency in respect of common mode signals at the first and second inputs of the instrumentation amplifier.

2. The instrumentation amplifier according to claim 1, wherein the second cut-off frequency is higher than the first cut-off frequency.

3. The instrumentation amplifier according to claim 1, wherein the feedback network has a gain of more than 1 (one) for common mode signals at the first and second inputs of the instrumentation amplifier at 50 Hz and/or at 60 Hz.

4. The instrumentation amplifier according to claim 1, wherein the first and second amplifiers are combined forming a dual difference amplifier.

5. The instrumentation amplifier according to claim 1, wherein the active filter comprises two low pass gm-C filters.

6. The instrumentation amplifier according to claim 5, wherein each gm-C filter comprises a transconductance amplifier and a capacitor.

7. The instrumentation amplifier according to claim 6, wherein at least one capacitor is a parasitic capacitor.

8. The instrumentation amplifier according to claim 1, wherein the first and second amplifiers each have a non-inverting input and an inverting input, wherein the first and second inputs are provided to the non-inverting inputs, and wherein the feedback network further comprises:
    a first low pass gm-C filter connected between the output or an intermediate node and the inverting input of the first amplifier;
    a second low pass gm-C filter connected between the output or an intermediate node and the inverting input of the second amplifier; and
    a capacitor connected between the inverting inputs of the first and second amplifiers.

9. The instrumentation amplifier according to claim 1, further comprising a common mode feedback circuit, which comprises a resistive divider connected between the outputs of the first and second amplifiers, and a comparator for comparing the divider output with a reference voltage, wherein the comparison result is provided to the feedback network.

10. The instrumentation amplifier according to claim 1, wherein the first cut-off frequency is less than the signal bandwidth of interest of the differential input signals.

11. The instrumentation amplifier according to claim 10, wherein the first cut-off frequency is 0.5 Hz or lower.

12. The instrumentation amplifier according to claim 1, wherein the second cut-off frequency is higher than expected common mode aggressors.

13. The instrumentation amplifier according to claim 12, wherein the second cut-off frequency is 200 Hz or higher.

14. A device for acquiring biopotential signals comprising an instrumentation amplifier as recited in claim 1.

15. A signal amplification method, comprising:
    amplifying a first input signal using a first amplifier;
    amplifying a second input signal using a second amplifier; and
    in a feedback network connected to the first and second amplifiers:
        applying a first low pass filter characteristic to differential mode signals between the first and second input signals thereby to pass differential DC signals and block differential mode signals at the frequencies of interest; and
        applying a second low pass filter characteristic to common mode signals between the first and second inputs signals thereby to pass and amplify common mode signals.

* * * * *